US008942931B2

(12) United States Patent
Bulumulla et al.

(10) Patent No.: US 8,942,931 B2
(45) Date of Patent: Jan. 27, 2015

(54) SYSTEM AND METHOD FOR DETERMINING ELECTRICAL PROPERTIES USING MAGNETIC RESONANCE IMAGING

(75) Inventors: Selaka Bandara Bulumulla, Niskayuna, NY (US); Laura Sacolick, Munich (DE); Desmond Teck Beng Yeo, Clifton Park, NY (US); Seung-Kyun Lee, Cohoes, NY (US); Thomas Kwok-Fah Foo, Clifton Park, NY (US); William Dixon, Clifton Park, NY (US)

(73) Assignee: General Electric Company, Schenectady, NY (US)

( * ) Notice: Subject to any disclaimer, the term of this patent is extended or adjusted under 35 U.S.C. 154(b) by 650 days.

(21) Appl. No.: 13/174,010

(22) Filed: Jun. 30, 2011

(65) Prior Publication Data
US 2012/0271571 A1    Oct. 25, 2012

Related U.S. Application Data

(60) Provisional application No. 61/477,470, filed on Apr. 20, 2011.

(51) Int. Cl.
*G01R 15/00*    (2006.01)
*G01R 33/24*    (2006.01)
*G01R 33/28*    (2006.01)

(52) U.S. Cl.
CPC ............ *G01R 33/246* (2013.01); *G01R 33/288* (2013.01)

USPC .............................................. 702/57; 324/309

(58) Field of Classification Search
CPC ............................ G01R 33/288; G01R 33/246
USPC .................... 702/57; 324/300–322
See application file for complete search history.

(56) References Cited

U.S. PATENT DOCUMENTS

| 8,125,225 | B2 * | 2/2012 | Koretsky et al. | 324/318 |
| 2006/0224061 | A1 | 10/2006 | Woo et al. | |
| 2009/0108844 | A1 * | 4/2009 | Sodickson et al. | 324/309 |
| 2010/0134105 | A1 * | 6/2010 | Zelinski et al. | 324/309 |
| 2010/0253338 | A1 * | 10/2010 | Eryaman et al. | 324/309 |
| 2010/0315084 | A1 * | 12/2010 | Sacolick et al. | 324/309 |

FOREIGN PATENT DOCUMENTS

| WO | WO 2007/017779 A2 | 2/2007 |
| WO | WO 2009/118688 A1 | 10/2009 |

\* cited by examiner

*Primary Examiner* — John Breene
*Assistant Examiner* — Stephanie Bloss
(74) *Attorney, Agent, or Firm* — Dean D. Small; The Small Patent Law Group

(57) ABSTRACT

A system and method for determining electrical properties using Magnetic Resonance Imaging (MRI) are provided. One method includes determining a magnitude of an MRI $B_1^+$ field applied to an object, determining a phase of the MRI $B_1^+$ field applied to the object and combining the determined magnitude and phase to determine a complex $B_1^+$ field estimate. The method further includes estimating one or more electrical properties of the object using the complex $B_1^+$ field estimate by directly solving at least one difference equation.

29 Claims, 13 Drawing Sheets

SYSTEM AND METHOD FOR DETERMINING ELECTRICAL PROPERTIES USING MAGNETIC RESONANCE IMAGING

CROSS-REFERENCE TO RELATED APPLICATIONS

This application claims priority to and the benefit of the filing date of U.S. Provisional Application No. 61/477,470, filed on Apr. 20, 2011, entitled "System And Method For Determining Electrical Properties Using Magnetic Resonance Imaging," which is hereby incorporated by reference in its entirety.

STATEMENT REGARDING FEDERALLY SPONSORED RESEARCH AND DEVELOPMENT

This invention was made with government support under U.S. Government Contract Number 5R01EB005307-2 awarded by the National Institutes of Health. The U.S. Government may have certain rights in this invention.

BACKGROUND

The subject matter disclosed herein relates generally to Magnetic Resonance Imaging (MRI), and more particularly to using MRI to determine electrical properties, such as the electrical properties of tissue.

MRI or Nuclear Magnetic Resonance (NMR) imaging generally provides for the spatial discrimination of resonant interactions between Radio Frequency (RF) waves and nuclei in a magnetic field. Specifically, MRI utilizes hydrogen nuclear spins of the water molecules in the human body, which are polarized by a strong, uniform, static magnetic field of a magnet. This magnetic field is commonly referred to as $B_0$ or the main magnetic field. When a substance, such as human tissue, is subjected to the main magnetic field, the individual magnetic moments of the spins in the tissue attempt to align with the main magnetic field. When excited by an RF wave, the spins precess about the main magnetic field at a characteristic Larmor frequency. A signal is emitted by the excited spins and processed to form an image.

A determination of tissue conductivity and permittivity are useful in estimating local RF power deposition (also known as local specific absorption rate) during MR imaging. This local distribution of RF power has come under increasing study with higher field imaging and with the use of multiple transmitters.

Tissue electrical properties may also be used during the therapeutic application of heat with RF, for example, RF hyperthermia. During the application of RF power, the temperature rise at a given location in the body is related to the tissue conductivity and the electric field strength at that location. The electric field strength and distribution in turn depend on the permittivity and conductivity values of the tissue types. Therefore, tissue electrical properties are parameters that may be used in hyperthermia treatment planning and optimization These electrical properties may also have diagnostic value as malignant tissue types have been shown to have higher permittivity and conductivity than surrounding healthy tissue.

The electrical properties of tissue may be estimated using Electrical Impedance Tomography (EIT), which uses electrodes placed on the surface of the body. Thereafter, currents are applied to the electrodes, resulting in voltages recorded by another set of electrodes. An inverse problem is then solved to estimate the conductivity and permittivity of tissue within the body. Thus, in EIT systems, electrodes must be used, which can be uncomfortable to patients. Additionally, significant computational resources may be needed to solve the inverse problem, which adds time to the overall processing.

The estimation of tissue electrical properties may also be performed using the spatial variation of a transmit magnetic field in MRI (with $B_1^+$ maps). However, in these known methods, in addition to the transmit field ($B_1^+$), the receiver sensitivity ($B_1^-$) and the z-component of the RF magnetic field ($H_z$) must be determined, which are not typically available.

BRIEF DESCRIPTION

In accordance with various embodiments, a non-transitory computer readable storage medium for estimating electrical properties of an object using a processor is provided. The non-transitory computer readable storage medium includes instructions to command the processor to determine a magnitude of a Magnetic Resonance Imaging (MRI) $B_1^+$ field applied to an object, determine a phase of the MRI $B_1^+$ field applied to the object and combine the determined magnitude and phase to determine a complex $B_1^+$ field estimate. The instructions further command the processor to estimate one or more electrical properties of the object using the complex $B_1^+$ field estimate by directly solving at least one difference equation.

In accordance with other various embodiments, a method for non-invasively imaging tissue properties is provided. The method includes generating Magnetic Resonance Imaging (MRI) $B_1^+$ maps to determine a magnitude of an MRI $B_1^+$ field applied to a subject using a plurality of Bloch-Siegert phase shift images and generating MRI phase maps to determine a phase estimate of the MRI $B_1^+$ field applied to the subject using real and imaginary images of the subject. The method further includes combining the determined magnitude and phase to determine a complex $B_1^+$ field estimate and estimating one or more tissue properties of the subject using the complex $B_1^+$ field estimate and a discrete set of Laplacian equations.

In accordance with yet other various embodiments, a Magnetic Resonance Imaging (MRI) system is provided that includes an imaging portion configured to generate an MRI $B_1^+$ field using one or more transmitters and acquire magnetic resonance (MR) $B_1^+$ data from an object using one or more receivers. The MRI system further includes a processing portion having an electrical properties estimation module configured to estimate electrical properties of the object by determining a magnitude of the MRI $B_1^+$ field applied to the object, determining a phase of the MRI $B_1^+$ field applied to the object, combining the determined magnitude and phase to determine a complex $B_1^+$ field estimate and estimating one or more electrical properties of the object using the complex $B_1^+$ field estimate by directly solving at least one difference equation.

DETAILED DESCRIPTION

Figure 1:
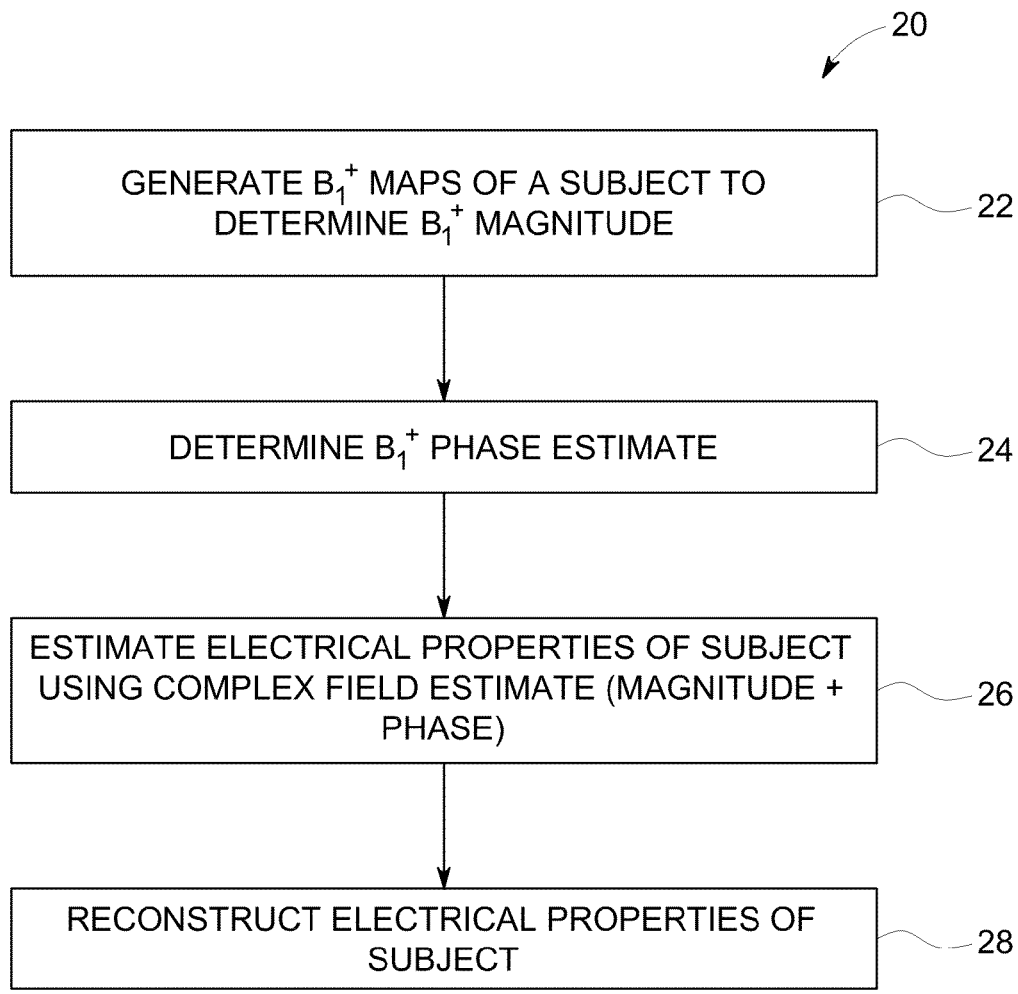
FIG. 1 is a flowchart of a method to determine the electrical properties of a subject using Magnetic Resonance Imaging (MRI) in accordance with various embodiments.

The foregoing summary, as well as the following detailed description of certain embodiments, will be better understood when read in conjunction with the appended drawings. To the extent that the figures illustrate diagrams of the functional blocks of various embodiments, the functional blocks are not necessarily indicative of the division between hardware. Thus, for example, one or more of the functional blocks may be implemented in a single piece of hardware or multiple pieces of hardware. It should be understood that the various embodiments are not limited to the arrangements and instrumentality shown in the drawings. Additionally, the system blocks in the various figures or the steps of the methods may be rearranged or reconfigured.

As used herein, an element or step recited in the singular and proceeded with the word "a" or "an" should be understood as not excluding plural of said elements or steps, unless such exclusion is explicitly stated. Furthermore, references to "one embodiment" are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

Various embodiments provide for the estimation of electrical properties (e.g., in clinically acceptable time frames for routine clinical use) of a subject using Magnetic Resonance Imaging (MRI). The various embodiments allow for real time estimation of local Radio-Frequency (RF) power deposition or in conjunction with mapping or images, provide diagnostically relevant information, such as for identifying tissue abnormality. At least one technical effect of some embodiments is the non-invasive estimation of the conductivity and permittivity of tissue using MRI in a clinically acceptable time frame. Other technical effects for some embodiments include evaluating RF safety, performing RF therapeutic methods and diagnosing tissue abnormality using MRI mapping of conductivity and permittivity.

In particular, various embodiments provide a system and method to directly calculate the conductivity and permittivity of tissue using $B_1^+$ maps. Specifically, the calculation may be performed using $B_1^+$ maps obtained in two-dimensional planes and without the use of receiver sensitivity information or the z-component of the RF magnetic field. For example, in various embodiments, a theoretical relationship between the spatial variation of $B_1^+$ and tissue electrical properties is defined and a discrete set of equations is thereby provided.

It should be noted that although the various embodiments may be described using a particular method to determine a particular property, for example, using a particular mapping scheme, such as using Bloch-Siegert $B_1^+$ mapping, variations and modifications are contemplated.

Various embodiments provide a method 20 as shown in FIG. 1 to determine the electrical properties of a subject (e.g., a patient) using MRI. For example, the in-vivo permittivity and conductivity of tissue may be estimated using an MRI system. The method 20 provides for imaging electrical properties using MRI $B_1^+$ maps. It should be noted that although the method 20 is described below in connection with imaging electrical properties in the axial plane, other planes may be used. Thus, the method 20 may use different planes. However, in the exemplary embodiment, $B_1^+$ maps from three axial planes are used in the estimate of electrical properties of the central axial plane.

The method 20 will first be generally described followed by a detailed description of each of the steps. The method 20 includes performing $B_1^+$ mapping of a subject at 20. The $B_1^+$ maps are generated to determine a corresponding $B_1^+$ magnitude at 22. Thereafter, the $B_1^+$ phase is determined at 24 using the images acquired during the $B_1^+$ mapping at 22. The magnitude of the $B_1^+$ field determined from the $B_1^+$ mapping at 22 and the $B_1^+$ phase determined at 24 may be combined in the complex domain to determine a complex $B_1^+$ field estimate. Accordingly, at 26, the electrical properties of the subject, which in this embodiment are conductivity and permittivity, are estimated using the complex field estimate (magnitude+phase) by directly solving a discrete difference equation as described below. The electrical properties of the subject are then reconstructed at 28.

Each of the steps of the method 20 will now be described in detail. In particular, a method 30 for $B_1^+$ mapping at 22 will be described in connection with FIG. 2. A method 40 for $B_1^+$ phase estimation will be described in connection with FIG. 3. A method 50 for estimating the electrical properties of the subject will be described in connection with FIG. 4. A method 60 for reconstructing the electrical properties will be described in connection with FIG. 5.

Figure 2:
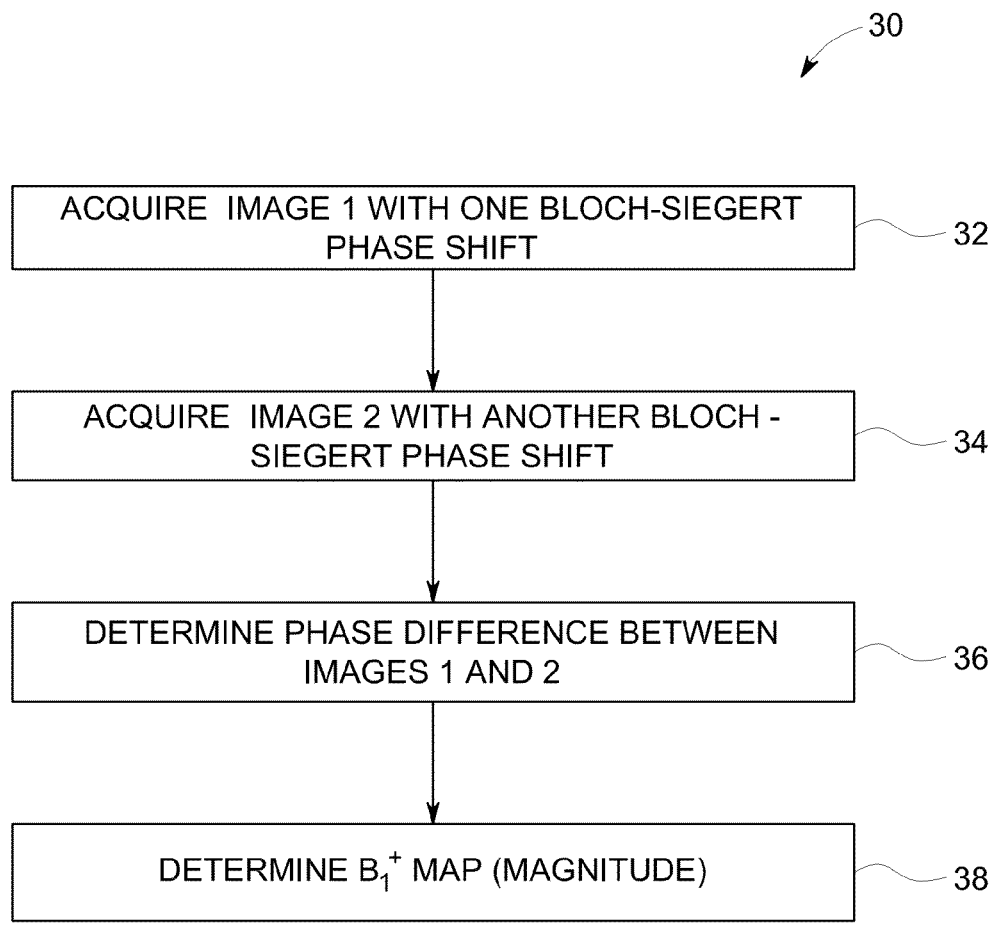
FIG. 2 is a flowchart of a method for $B_1$ mapping to determine a $B_1^+$ field magnitude in accordance with various embodiments.

In particular, and referring to FIG. 2, the method 30 for $B_1^+$ mapping to determine the $B_1^+$ field magnitude includes acquiring at 32 a first image (Image 1) with one Bloch-Siegert phase shift. For example, in one embodiment an off resonance image with positive frequency offset (e.g. +4 KHz from Larmor frequency) for each axial plane is acquired, which in the illustrative embodiment includes three axial planes. Thereafter, for each axial plane, another image (Image 2) with another Bloch-Siegert phase shift is acquired at 34. For example, in one embodiment, an off resonance image with negative frequency offset (e.g. −4 KHz from Larmor frequency) is acquired. The images (Images 1 and 2) may be acquired using any suitable MRI image acquisition technique such as using Bloch-Siegert phase shift or off resonance imaging. After acquiring the images, the phase difference of the two images for each plane is determined at 36, such as by using a suitable pixel subtraction method.

The $B_1^+$ map for each image slice is then determined at 38 by multiplying the phase difference by a scaling factor to realize the $B_1^+$ maps (magnitude) for each image slice. It should be noted that any suitable method for $B_1^+$ mapping may be used to determine the $B_1^+$ magnitude and the method 30 is merely one example. For example, $B_1^+$ mapping using a Bloch-Siegert shift may be used as described in U.S. Patent Application Publication 2010/0315084, entitled "System, Method, And Apparatus For Magnetic Resonance RF-Field Measurement", which is commonly owned.

Figure 3:
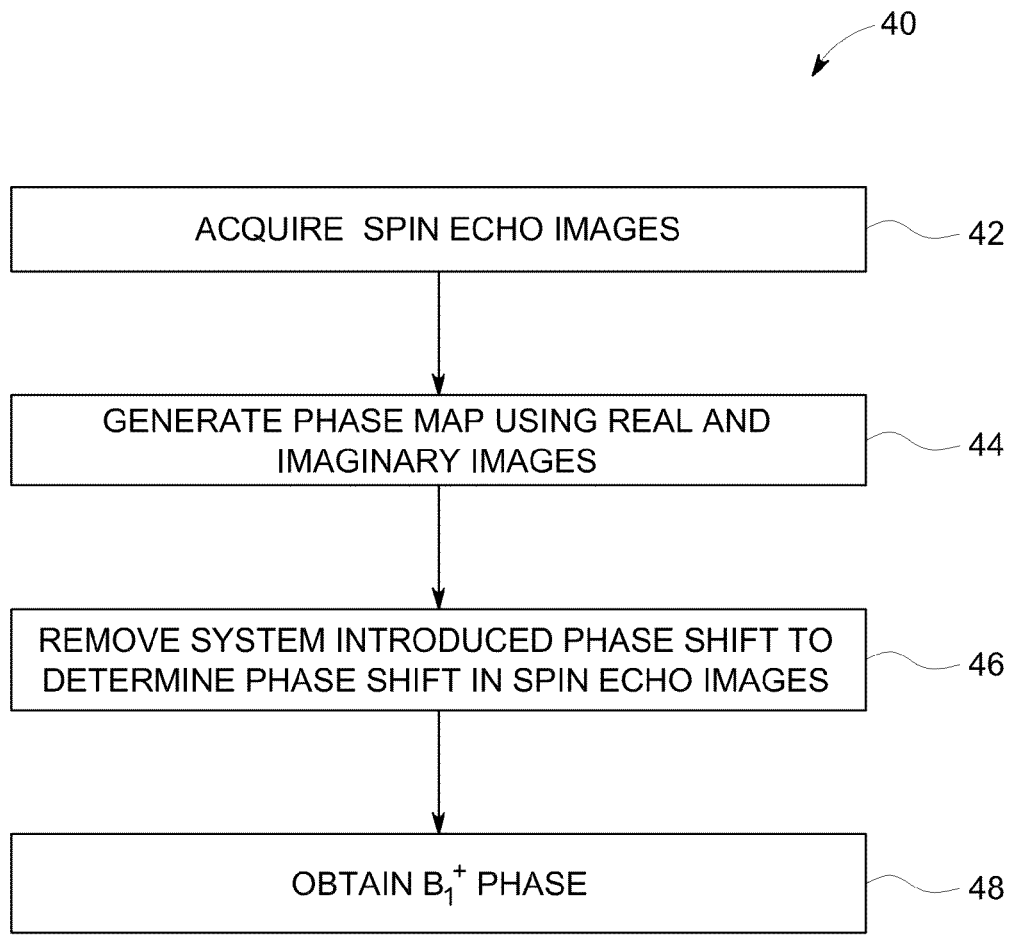
FIG. 3 is a flowchart of a method for $B_1^+$ phase estimation in accordance with various embodiments.

The $B_1^+$ phase estimate is determined in one embodiment using the method 40 shown in FIG. 3. The method 40 includes, for each axial plane, acquiring spin echo images of the subject at 42. The spine echo images may be acquired using any suitable spin echo imaging technique. For example, the spin echo images may be acquired using a switched mode, quadrature coil (e.g., a birdcage type body coil or transmit/receive head coil). Thereafter, a phase map is generated at 44 using the real and imaginary images of each plane.

A system introduced linear phase shift, if any, is then removed at 46. For example, some MRI systems introduce phase variation during image acquisition, which is removed or corrected at 46, such that only the subject (or sample) induced or introduced phase variation is determined. The system introduced phase shift may be removed, for example, by comparing the spin echo images and phantom images acquired by the MRI system. Thus, the phantom image is used as a reference image and compared to the spin echo images of the subject. In one embodiment, the linear phase variation for each line of the images is determined and fit to curve (e.g., a straight line fit) and then removed (e.g., subtracted from the images). Removing the system introduced phase variation results in a determination of the phase shift in the spin echo images due to the subject.

Thereafter, at 48, the $B_1^+$ phase for each axial plane is determined. For example, in one embodiment, for each axial plane, the determined phase is divided by two and conjugated to obtain the $B_1^+$ phase. It should be noted that the $B_1^+$ phase estimate described above is merely for illustration and any suitable $B_1^+$ phase estimation technique may be used.

Figure 4:
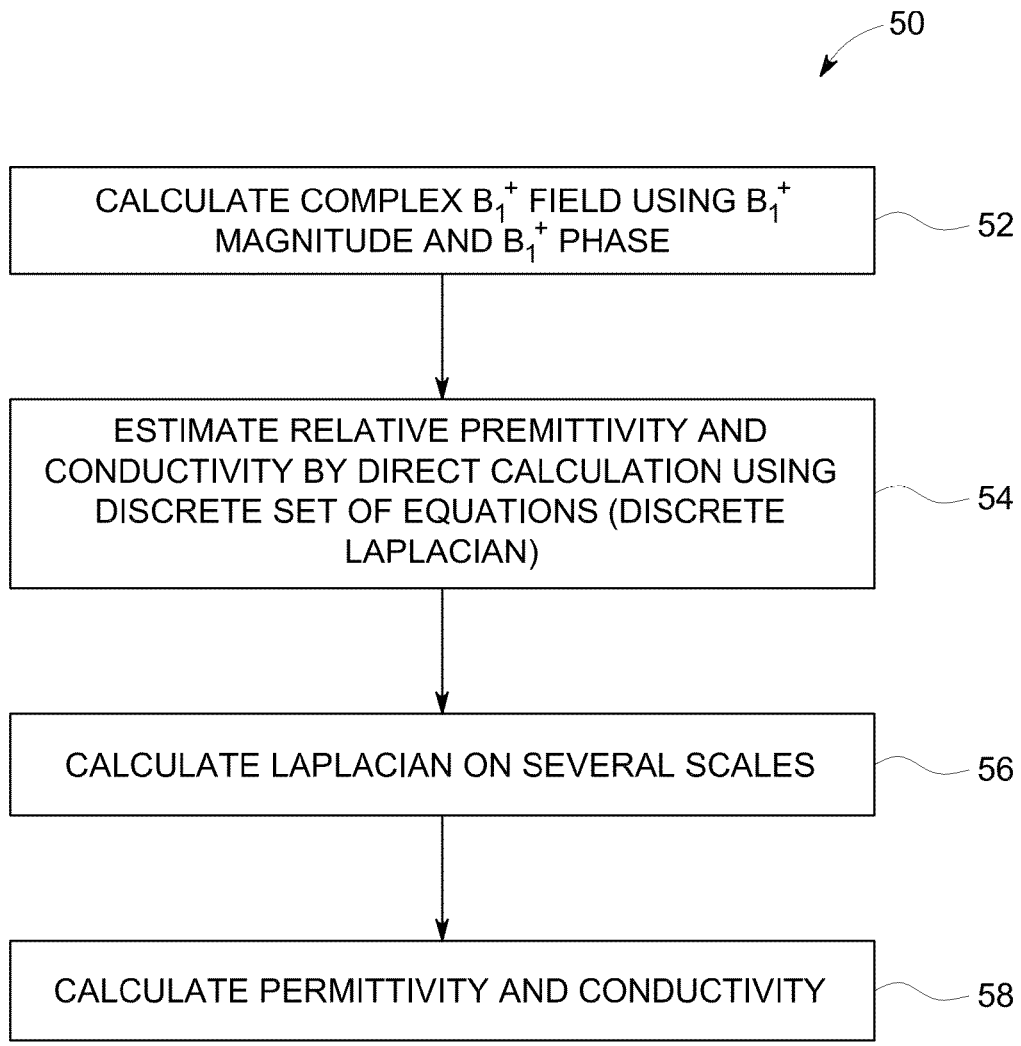
FIG. 4 is a flowchart of a method to estimate the electrical properties of a subject in accordance with various embodiments.

Accordingly, after performing the methods 30 and 40, the $B_1^+$ magnitude and phase are determined for the complex $B_1^+$ field, which is used to estimate the electrical properties using the method 50 as shown in FIG. 4. In various embodiments, the method 50 includes directly solving a discrete set of difference equations in a single step operation. In particular, the method 50 includes at 52 combining the $B_1^+$ magnitude and the $B_1^+$ phase to generate a complex $B_1^+$ ($B_1^+$ field) for each axial plane. For example, a matrix type combination of the $B_1^+$ magnitude and the $B_1^+$ phase in the complex domain may be performed.

Thereafter, using the three axial planes and the complex $B_1^+$ maps, the relative permittivity and conductivity for central axial plane is estimated at 54. In particular, the relative permittivity and conductivity are estimated using a discrete set of difference equations as described below, which includes calculating the discrete Laplacian in various embodiments.

In some embodiments, the Laplacian is calculated on several scales at 56 to improve the estimate (reduce the impact of noise), and then the results are combined. For example, the calculation may be performed on a larger volume and not just on the next to adjacent pixels (e.g., extend beyond the next to adjacent pixels). Thus, estimates over a larger area or volume may be used, such that estimates from a multi-scale evaluation are combined. The relative permittivity and conductivity are then calculated at 58 using the calculated Laplacians.

In one embodiment, the estimation at 54, and the calculations at 56 and 58 are performed as follows. In particular, in this embodiment, a theoretical relationship between the spatial variation of $B_1^+$, conductivity and permittivity is provided. Using the phasor notation for time harmonic fields, the circularly polarized, transmit magnetic field $B_1^+$ (x) at location x=(x,y,z) is given by:

$$B_1^+(x) = \frac{\mu}{2}(H_x(x) + jH_y(x)) \quad (1)$$

where $\mu$ is the permeability, and $H_x$ and $H_y$ are the complex x and y components of the magnetic field. It should be noted that reference to equation numbers herein corresponds to the number within the parenthetical after the equation.

The spatial variation of $B_1^+$ then may be related to electrical properties starting with Ampere's Law and Faraday's Law and using the divergence equation. In this illustrated embodiment, a derivation using the Helmholtz equation is provided as follows. In a source free region, the x and y components of the magnetic field satisfies:

$$\nabla^2 H_x(x) + \omega^2 \mu\varepsilon(x)\left(1 + \frac{\sigma(x)}{j\omega\varepsilon(x)}\right)H_x(x) = 0 \quad (2)$$

$$\nabla^2 H_y(x) + \omega^2 \mu\varepsilon(x)\left(1 + \frac{\sigma(x)}{j\omega\varepsilon(x)}\right)H_y(x) = 0 \quad (3)$$

where $\nabla^2$ ( ) is the Laplace operator, $\omega$ is the frequency in radians, $\mu$ is the permeability, $\varepsilon$ is the permittivity, ($\varepsilon = \varepsilon_r \varepsilon_0$, where $\varepsilon_r$ is the relative permittivity, $\varepsilon_0 = 8.8542 \cdot 10^{-12}$ F/m is the free space permittivity), and $\sigma$ is the conductivity: In one embodiment, the permeability $\mu$ is assigned $4\pi \cdot 10^{-7}$ H/m, which is valid for all tissue types. Then, performing (Equation 2)+j (Equation 3) using the definition of $B_1^+$ (from Equation 1) and recognizing the linearity of Laplace operator, the following is defined:

$$\nabla^2 B_1^+(x) + \omega^2 \mu\varepsilon(x)\left(1 + \frac{\sigma(x)}{j\omega\varepsilon(x)}\right)B_1^+(x) = 0 \quad (4)$$

Thereafter, by separating the real and imaginary components, the following theoretical equations defining the relationship between the spatial variation of $B_1^+$, conductivity and permittivity result:

$$\varepsilon_r(x) = \frac{-1}{\omega^2 \mu\varepsilon_0} \mathrm{Re}\left\{\frac{1}{B_1^+(x)} \nabla^2 B_1^+(x)\right\} \quad (5)$$

$$\sigma(x) = \frac{1}{\omega\mu} \mathrm{Im}\left\{\frac{1}{B_1^+(x)} \nabla^2 B_1^+(x)\right\} \quad (6)$$

where the material properties of relative permittivity ($\varepsilon_r$) and conductivity ($\sigma$) are given in terms of the transmit field $B_1^+$.

It should be noted that variations and modifications to Equations 5 and 6 are contemplated. For example, the Laplacian in Equations 5 and 6 may also be estimated using a curve fitting method. For example, a second order polynomial can be fitted to the $B_1^+$ data in a piecewise manner in each dimension (x, y and z) to obtain estimates of the Laplacian. Additionally, a multi-dimensional fitting may be used instead of a single dimensional fitting.

It should be noted that the electrical properties estimate can also be performed using $B_1^-$ data (receive field sensitivity) instead of $B_1^+$ data (transmit field sensitivity). For example, the $B_1^-$ amplitude data can be obtained from the receiver sensitivity map produced during coil calibration. For the phase, as in the case of $B_1^+$ phase, a spin echo phase divided by two can be used as an approximation to the $B_1^-$ phase. Alternatively, amplitude-only data can be used to estimate the permittivity of the sample using Equation 11 below. In various embodiments, the equations for estimating electrical properties from complex $B_1^-$ data may be defined as follows:

$$B_1^{-*} = \frac{\mu}{2}(H_x - jH_y) \quad (7)$$

$$B_1^{-*} = \frac{1}{j\omega\mu(\sigma + j\omega\epsilon)}\left\{\frac{\partial^2}{\partial x^2}B_1^{-*} + \frac{\partial^2}{\partial y^2}B_1^{-*} + \frac{\partial^2}{\partial z^2}B_1^{-*}\right\} \quad (8)$$

$$\sigma + j\omega\epsilon = \frac{1}{j\omega\mu B_1^{-*}}\left\{\frac{\partial^2}{\partial x^2}B_1^{-*} + \frac{\partial^2}{\partial y^2}B_1^{-*} + \frac{\partial^2}{\partial z^2}B_1^{-*}\right\} \quad (9)$$

$$\hat{\sigma} = \text{Re}\left\{\frac{1}{j\omega\mu B_1^{-*}}\left(\frac{\partial^2}{\partial x^2}B_1^{-*} + \frac{\partial^2}{\partial y^2}B_1^{-*} + \frac{\partial^2}{\partial z^2}B_1^{-*}\right)\right\} \quad (10)$$

$$\hat{F}_r = \frac{1}{\omega\epsilon_0}\text{Im}\left\{\frac{1}{j\omega\mu B_1^{-*}}\left(\frac{\partial^2}{\partial x^2}B_1^{-*} + \frac{\partial^2}{\partial y^2}B_1^{-*} + \frac{\partial^2}{\partial z^2}B_1^{-*}\right)\right\} \quad (11)$$

Now, with respect to the discrete set of equations used at 54, equations to evaluate discrete data are provided by expanding Equation 5 as follows:

$$\epsilon_r(x) = \frac{-1}{\omega^2\mu\epsilon_0}\text{Re}\left\{\frac{1}{B_1^+(x)}\left(\frac{\partial^2}{\partial x^2}B_1^+(x) + \frac{\partial^2}{\partial y^2}B_1^+(x) + \frac{\partial^2}{\partial z^2}B_1^+(x)\right)\right\} \quad (12)$$

It should be noted that it is assumed that the volume of interest is discretized in steps of $(\Delta x, \Delta y, \Delta z)$ such that the location $x = (i\Delta x, j\Delta y, k\Delta z)$ can be represented as (i,j,k). The partial second derivatives can then be represented as:

$$\frac{\partial^2}{\partial x^2}B_1^+(x) : \frac{B_1^+(i+2,j,k) - 2B_1^+(i,j,k) + B_1^+(i-2,j,k)}{4\Delta x^2} \triangleq \delta_1(i,j,k) \quad (13)$$

$$\frac{\partial^2}{\partial y^2}B_1^+(x) : \frac{B_1^+(i,j+2,k) - 2B_1^+(i,j,k) + B_1^+(i,j-2,k)}{4\Delta y^2} \triangleq \delta_2(i,j,k) \quad (14)$$

$$\frac{\partial^2}{\partial z^2}B_1^+(x) : \frac{B_1^+(i,j,k+2) - 2B_1^+(i,j,k) + B_1^+(i,j,k-2)}{4\Delta z^2} \triangleq \delta_3(i,j,k) \quad (15)$$

Then, the permittivity is defined by the following discrete equation:

$$\hat{\epsilon}_r(i,j,k) = \quad (16)$$
$$\frac{-1}{\omega^2\mu\epsilon_0}\text{Re}\left\{\frac{1}{B_1^+(i,j,k)}(\delta_1(i,j,k) + \delta_2(i,j,k) + \delta_3(i,j,k))\right\}$$

Similarly, the conductivity is defined by the following discrete equation:

$$\hat{\sigma}(i,j,k) = \frac{1}{\omega\mu}\text{Im}\left\{\frac{1}{B_1^+(i,j,k)}(\delta_1(i,j,k) + \delta_2(i,j,k) + \delta_3(i,j,k))\right\} \quad (17)$$

Equations 16 and 17 above, show that in order to estimate relative permittivity and conductivity at location (i,j,k), $B_1^+$ data is used at (i,j,k), (i±2,j,k), (i,j±2,k), (i,j,k±2) points, for a total of seven data points in this embodiment. Thus, Equations 7 and 8 define a discrete set of difference equations that can be solved directly, such as in a single processing step.

It should be noted that Equations 16 and 17 may be expressed in different ways, for example, as:

$$\hat{\sigma} = \text{Re}\left\{\frac{1}{j\omega\mu B1+}\left(\frac{\partial^2 B1+}{\partial x^2} + \frac{\partial^2 B1+}{\partial y^2} + \frac{\partial^2 B1+}{\partial z^2}\right)\right\} \quad (18)$$

$$\hat{\epsilon}_r = \frac{1}{\omega\epsilon_0}\text{Im}\left\{\frac{1}{j\omega\mu B1+}\left(\frac{\partial^2 B1+}{\partial x^2} + \frac{\partial^2 B1+}{\partial y^2} + \frac{\partial^2 B1+}{\partial z^2}\right)\right\} \quad (19)$$

It also should be noted that other methods may be used to generate the electrical properties data. For example, the various embodiments may use any suitable method for calculating the discrete Laplacian, such as using the adjacent pixels. Thus, while Equations 16 and 17 define one method of calculating the discrete Laplacian, other methods may be used. For example, different integer values instead of ±2 may be used, such as ±1.

Additionally, although various embodiments describe using seven $B_1^+$ pixels to estimate the electrical properties of a single pixel, other numbers of pixels (more or less than seven) may be used, such as based on the method used in the calculation of the discrete Laplacian.

The determination of permittivity and conductivity using method 20 may be performed, for example, using a birdcage coil. In one embodiment, the birdcage coil may be a birdcage type, quadrature transmit/receive coil used to acquire MRI data from a human head, in particular, to obtain $B_1^+$ data in the axial plane.

For example, the transmit birdcage coil may be a 16-rung birdcage coil, having a diameter 28 cm, and a rung length 28 cm. The frequency of excitation for the coil in the illustrative embodiment is 128 MHz and the birdcage coil is a low pass birdcage coil operating in a 3.0T imaging system.

When acquiring data, in addition to the central axial slice, $B_1^+$ data for two slices, such as at 5 mm spacing in the superior direction (+z-direction) and two slices, such as at 5 mm spacing in the inferior direction (−z-direction), for a total of five slices may be used in the various embodiments.

Figure 6:
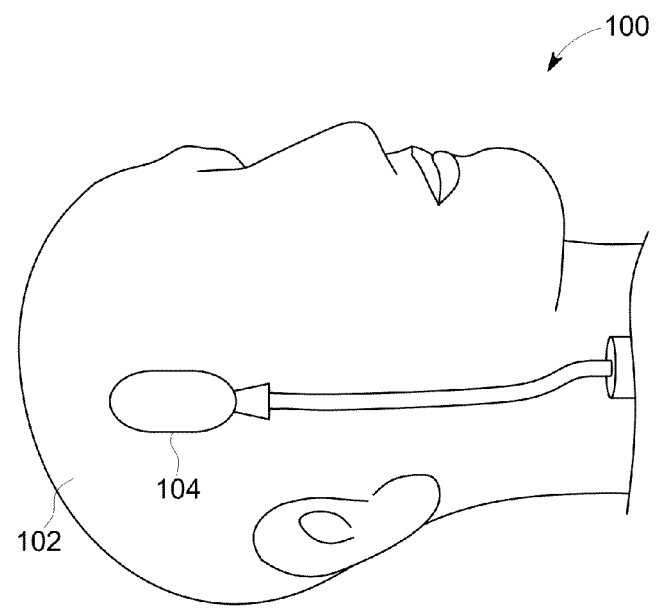
FIG. 6 is a diagram of an exemplary head phantom.

As another example, the various embodiments are used to estimate the electrical properties of a head phantom 100 as shown in FIG. 6 and/or a human head. The head phantom 100 in this embodiment is filled with two types of fluids, one fluid in the outer compartment 102, and the second fluid in an inner, smaller compartment 104 (e.g., 20 mm diameter, 35 mm long).

In one embodiment, the phantom 100 is filled with non-conducting fluids and the relative permittivity estimated using $B_1^+$ magnitude data. In another embodiment, the inner compartment 104 is filled with a salt solution and both the relative permittivity and conductivity are estimated using the $B_1^+$ magnitude and phase data.

In these embodiments, the $B_1^+$ magnitude data is acquired using the Bloch-Siegert shift $B_1^+$ mapping method described in U.S. Patent Application Publication 2010/0315084. However, other $B_1^+$ mapping methods may be used, for example, dual flip angle or multiple flip angle methods.

In one embodiment, the outer compartment 102 of the head phantom 100 is filled with 50% (volume) iso-propanol and 50% distilled water solution. The inner compartment 104 is filled with distilled water. In order to reduce the T1 relaxation time, copper sulphate may be added to both solutions until the concentration is 1 g/liter of copper sulphate in the final prepared solution.

The known relative permittivity is 18 for iso-propanol and 81 for distilled water. Thus, with the dielectric mixture formula, the 50% mixture in the outer compartment 102 should have a relative permittivity of 43.8. Because the phantom head 100 is filled with non-conducting fluids, only the relative permittivity is estimated. With reference to Equation 6, note that if the spatial variation of $B_1^+$ phase is slow, the phase terms in the numerator and denominator cancel out. As a result, the permittivity is approximately:

$$\varepsilon_r(x) \approx \frac{-1}{\omega^2 \mu \varepsilon_0} \left\{ \frac{1}{|B1^+(x)|} \nabla^2 |B1^+(x)| \right\} \quad (20)$$

Thus, the estimate is as follows:

$$\hat{\varepsilon}_r = (i, j, k) \approx \quad (21)$$
$$\frac{-1}{\omega^2 \mu \varepsilon_0} \operatorname{Re}\left\{ \frac{1}{|B1^+(i, j, k)|} (\delta_1(i, j, k) + \delta_2(i, j, k) + \delta_3(i, j, k)) \right\}$$

where the partial derivative terms $\delta_1(i,j,k)$ and $\delta_2(i,j,k)$ are also calculated using only the magnitude of $B_1^+$.

The head phantom 100 may be imaged using a quadrature head coil having sixteen rungs and operating in quadrature transmit and receive modes. The head phantom 100 is aligned such that the central axial plane bisects the inner compartment 104 of the head phantom 100.

Figure 7:
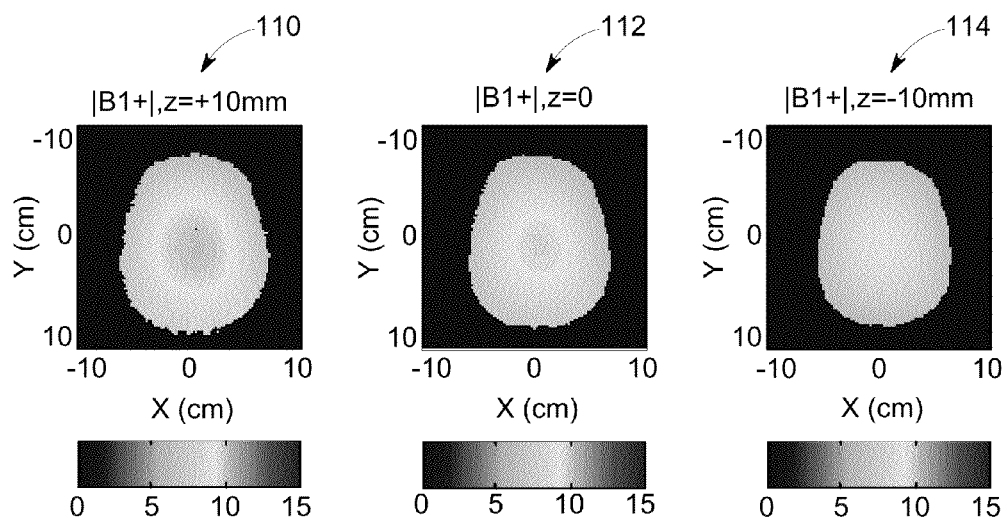
FIG. 7 illustrates images of $B_1^+$ maps formed in accordance with various embodiments.

MRI data then may be acquired using, for example, Bloch-Siegert based $B_1^+$ mapping data, with a 3.0T MRI scanner, for three axial plane slices with the following parameters: FOV 24 cm, slice thickness 5 mm, spacing 5 mm, resolution 128×128, TE 30 ms, TR 800 ms. The $B_1^+$ maps 110 (+10 mm S/I direction shift), 112 (central axial plane) and 114 (−10 mm S/I direction shift) are shown in FIG. 7, with units in µTesla.

The $B_1^+$ data is then used in the calculation of relative permittivity. In one embodiment, at each pixel, the calculation results are accepted if the results are within the 1-100 range, and discarded otherwise. It should be noted that the estimate depends on the spatial variation of $B_1^+$. As can be seen, at 3.0T, sufficient $B_1^+$ variation exists to allow calculation of electrical properties. However, $B_1^+$ maps obtained may have additional noise terms that affect the electrical properties estimate. Accordingly, in various embodiments, the Laplacian is evaluated over a larger volume. In one embodiment, in order to estimate electrical properties of the central axial slice with only three axial plane slices, the Laplacian is evaluated on a larger in plane area, rather than in a larger volume.

In particular, an integer skip factor (sf=1, 2, 3, . . . ) is defined. Then, the x and y partial derivatives are estimated as:

$$\delta_1(i, j, k) = \frac{B1^+(i+2*sf, j, k) - 2B1^+(i, j, k) + B1^+(i-2*sf, j, k)}{4(sf*\Delta x)^2} \quad (22)$$

$$\delta_2(i, j, k) = \frac{B1^+(i, j+2*sf, k) - 2B1^+(i, j, k) + B1^+(i, j-2*sf, k)}{4(sf*\Delta y)^2} \quad (23)$$

It should be noted that other methods may be used to generate the electrical properties data on a multi-slice scale and the equations above are merely exemplary. For example, different integer values instead of 2 may be used, such as 1.

Figure 8:
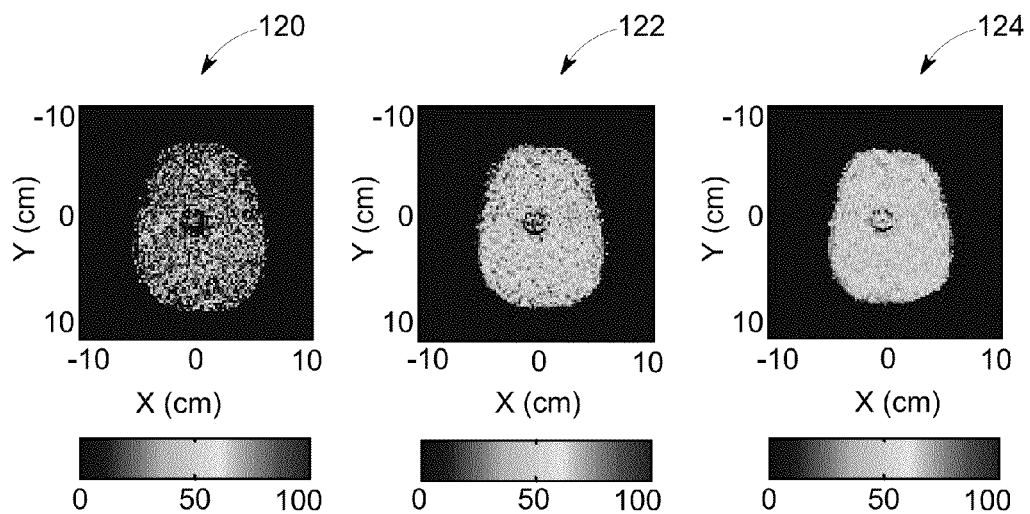
FIG. 8 illustrates images of calculated permittivity maps showing skip factors in accordance with various embodiments.

It also should be noted that similar calculations for the z partial derivative can be performed when multiple axial plane slices are available or when $B_1^+$ data is acquired in a 3D volume. The calculated permittivity maps 120, 122 and 124, for skip factors 1, 2, and 3, respectively, are shown in FIG. 8. Thus, the images of the permittivity maps 120, 122 and 124 illustrate calculation with the Laplacian over incrementally larger areas (such as at 56 of FIG. 4).

Figure 9:
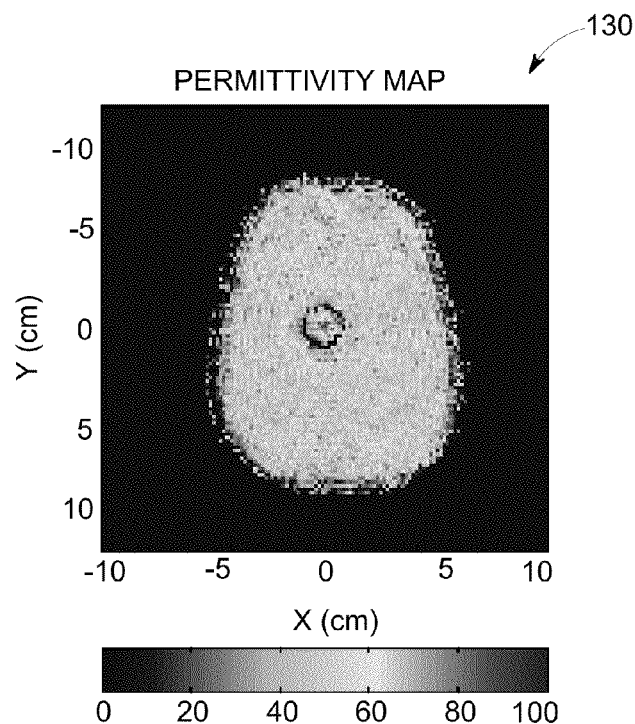
FIG. 9 illustrates an image of a relative permittivity map formed in accordance with various embodiments

In general, the relative permittivity estimates improve as the skip factor increases. However, when larger skip factors are used, poor or less accurate estimates at material boundaries may occur. As invalid estimates are discarded, the image boundaries get smaller and smaller. In one embodiment, the permittivity images for skip factors 1, 2 and 3 may be calculated and combined, namely combining the three images. At any given pixel, an average is calculated using only valid data points from the three images. In an alternative embodiment, higher skip factors may be estimated as follows: if a valid estimate is available from skip factor=3 image, this estimate is given preference over skip factor=2 image pixel and skip factor=1 image pixel; similarly, if a valid estimate is available from skip factor=2 image, this estimate is given preference over skip factor=1 image pixel. The resulting relative permittivity map 130 is shown in FIG. 9. The image shows the lower relative permittivity of the outer compartment 102 and the higher relative permittivity of the inner compartment 104 of the head phantom 100 (all shown in FIG. 6).

Figure 10:
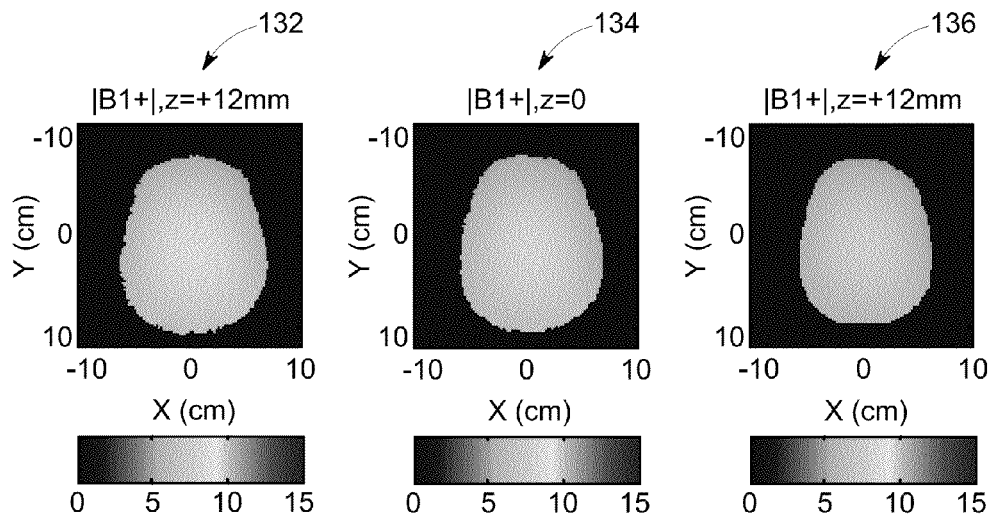
FIG. 10 illustrates images of $B_1^+$ maps formed in accordance with various embodiments.

In another embodiment, and to illustrate the various embodiments, the inner compartment 104 is filled with a NaCl solution (9 g/liter) and 1 g/liter of copper sulphate. Data for Bloch-Siegert based $B_1^+$ mapping is acquired for three axial plane slices with the following parameters: FOV 24 cm, slice thickness 6 mm, spacing 6 mm, resolution 128×128, TE 30 ms, TR 800 ms. The image data is then processed to generate $B_1^+$ magnitude maps for each axial slice as described herein. The $B_1^+$ maps 132 (+12 mm S/I direction shift), 134 (central axial plane), and 136 (−12 mm S/I direction shift) are shown in FIG. 10, with units in µTesla.

As described above, in order to estimate conductivity, the $B_1^+$ phase, in addition to $B_1^+$ magnitude is used. It should be noted that the phase of a spin echo image in a switched mode, quadrature birdcage coil is approximately half of the $B_1^+$ phase. Under axial rotational and mirror symmetry, this relationship is exact. Therefore, spin echo images may be acquired for all three slices with the same alignment, but with a TR of, for example, 400 ms. The phase encoding direction in this embodiment is A/P (anterior/posterior) for these images.

Figure 11:
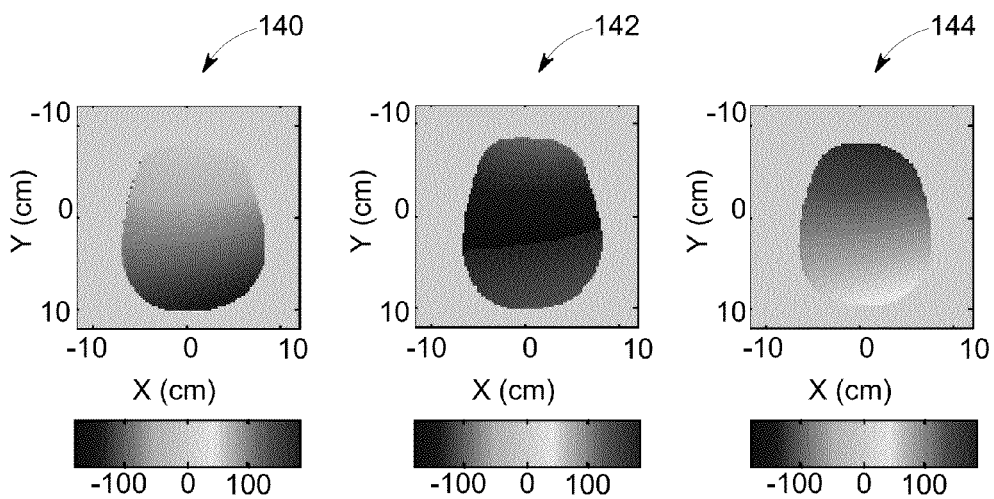
FIG. 11 illustrates images having an original spin echo image phase.
Figure 12:
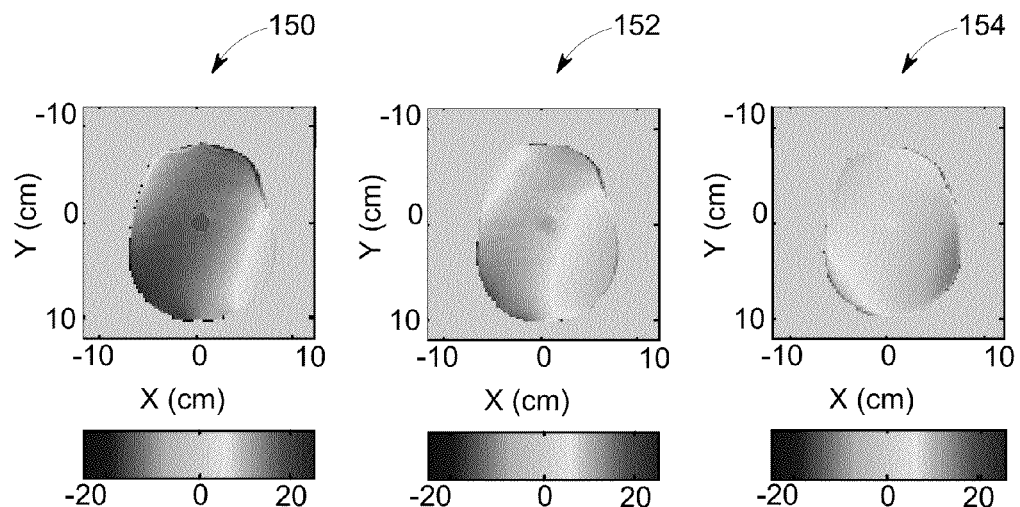
FIG. 12 illustrates images with a system introduced phase component removed.

However, the spin echo images have a linear, or other slowly varying phase term in the phase encoding direction, unrelated to phase variation due to imaging sample properties. As described herein, the system introduced linear phase term may be removed (at 46 of FIG. 3). In one embodiment, the system introduced linear phase term is removed using the autocorrelation of image pixels and the constant phase term using histogram analysis. Thus, the spin echo image phase may be corrected. The original spin echo image phase and the phase after removing the linear and constant phase terms are shown in the images 140, 142 and 142 of FIG. 11 and the images 150, 152 and 154 of FIG. 12, respectively.

Figure 13:
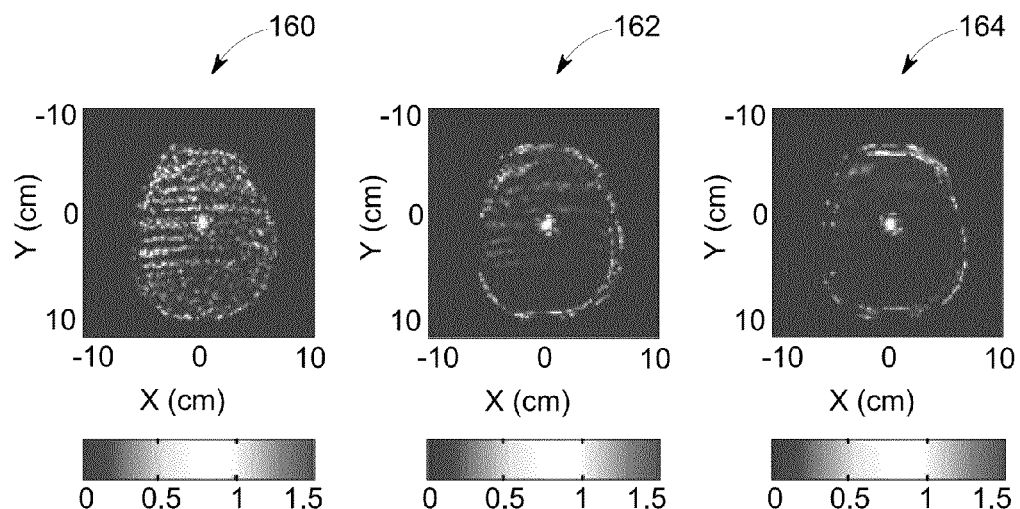
FIG. 13 illustrates images of conductivity maps with skip factors in accordance with various embodiments.
Figure 14:
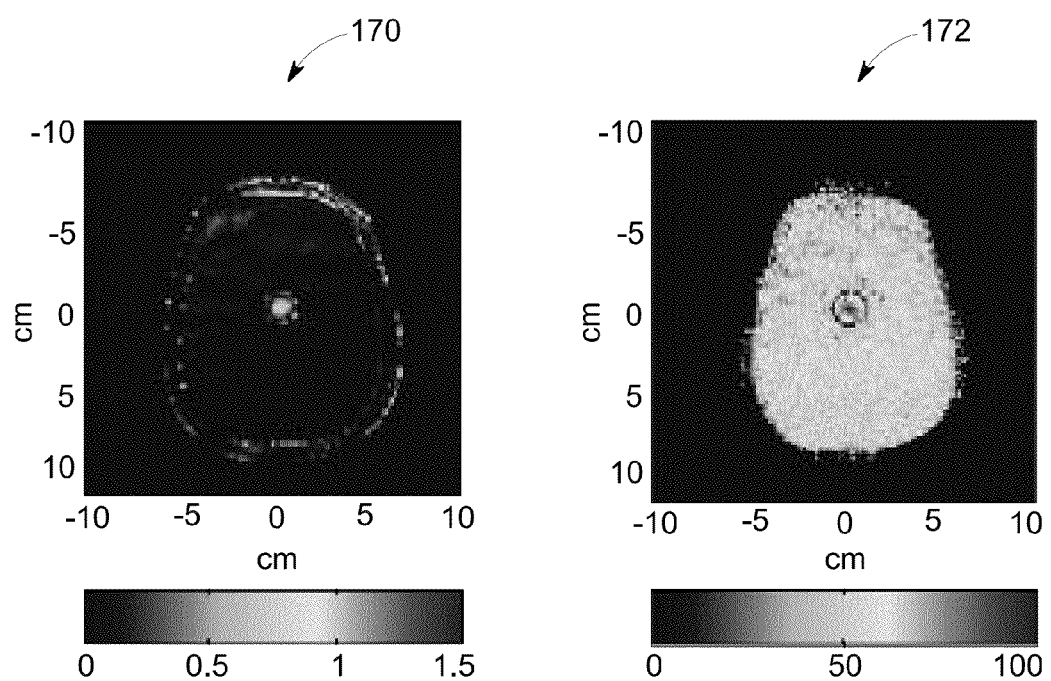
FIG. 14 illustrates images of relative permittivity maps formed in accordance with various embodiments

The corrected spin echo phase and $B_1^+$ magnitude data are then combined to obtain the complex $B_1^+$ for the three axial plane slices and Equations 16 and 17 are evaluated to obtain conductivity and relative permittivity. To improve the estimates, three images with skip factors 1, 2, and 3 (over incrementally larger areas) may be calculated and combined as described herein. The calculated conductivity maps 160, 162 and 164 for skip factors 1, 2, and 3, respectively, are shown in FIG. 13. The conductivity images incrementally improve as the skip factor increases. There is likewise a similar improvement in the permittivity maps (not shown). The final conductivity and permittivity maps 170 and 172 for the central axial plane, after combining the intermediate maps, are shown in FIG. 14.

Figure 5:
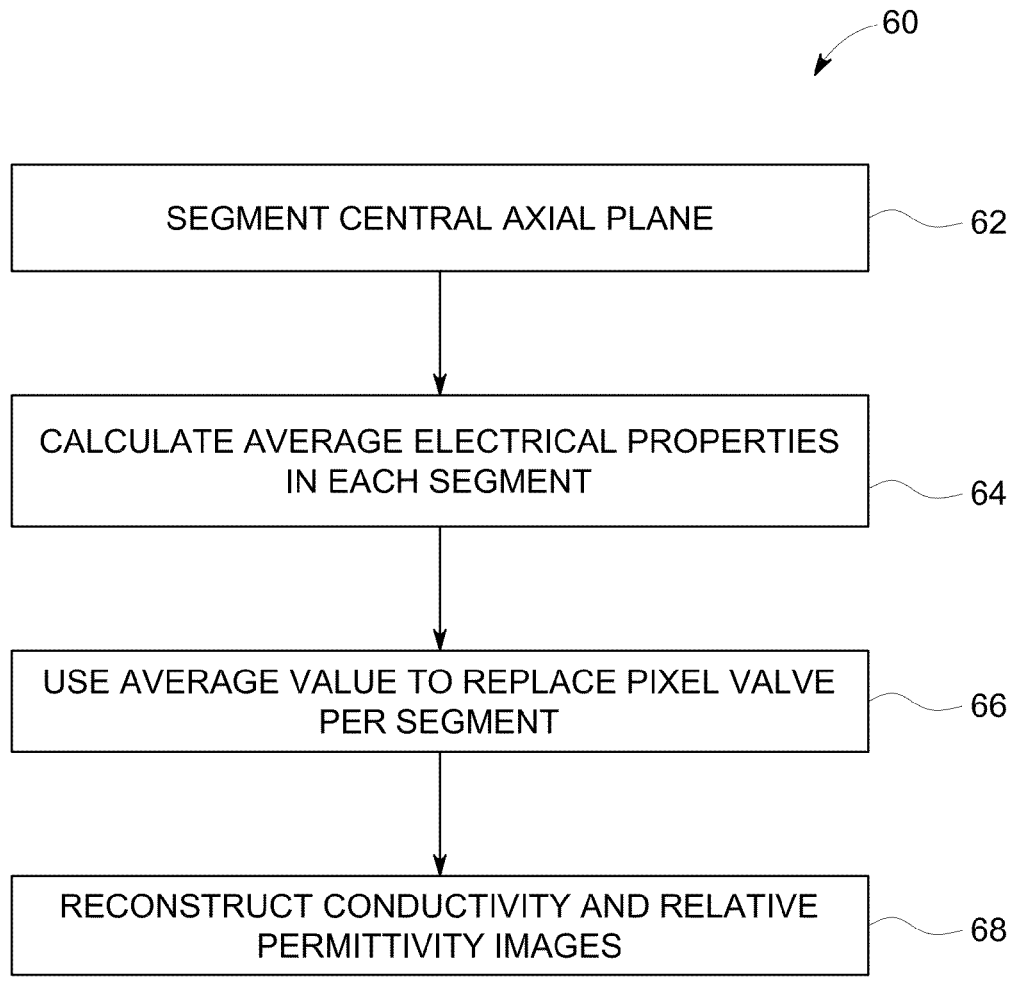
FIG. 5 is a flowchart of a method to reconstruct the electrical properties of a subject in accordance with various embodiments.

Referring now to the method 60 of FIG. 5, the reconstruction of electrical properties may be performed, such as image reconstruction, after the estimation using the method 50 of FIG. 4. The method 60 includes segmenting the central axial plane at 62. For example, the central axial plane may be segmented (e.g., divided into segments) using the spin echo image and the intensity of the pixel values to select segments that have pixel intensity values in the same range. It should be noted that the segments may be disjoint such that the union of the segments results in the outline of the original spin echo image. Thereafter, the average electrical properties in each segment are calculated at 64. Then, for a given segment, all of the pixel values within that segment are replaced with the average pixel value at 66. Thereafter, at 68, conductivity and relative permittivity images are reconstructed by summing the segments together.

Accordingly, certain regions are selected to have particular tissue types and then the pixel values are averaged and all pixels within a segment are replaced with that value. It should be noted that different ranges and numbers of thresholds may be used to define the different segments.

Figure 15:
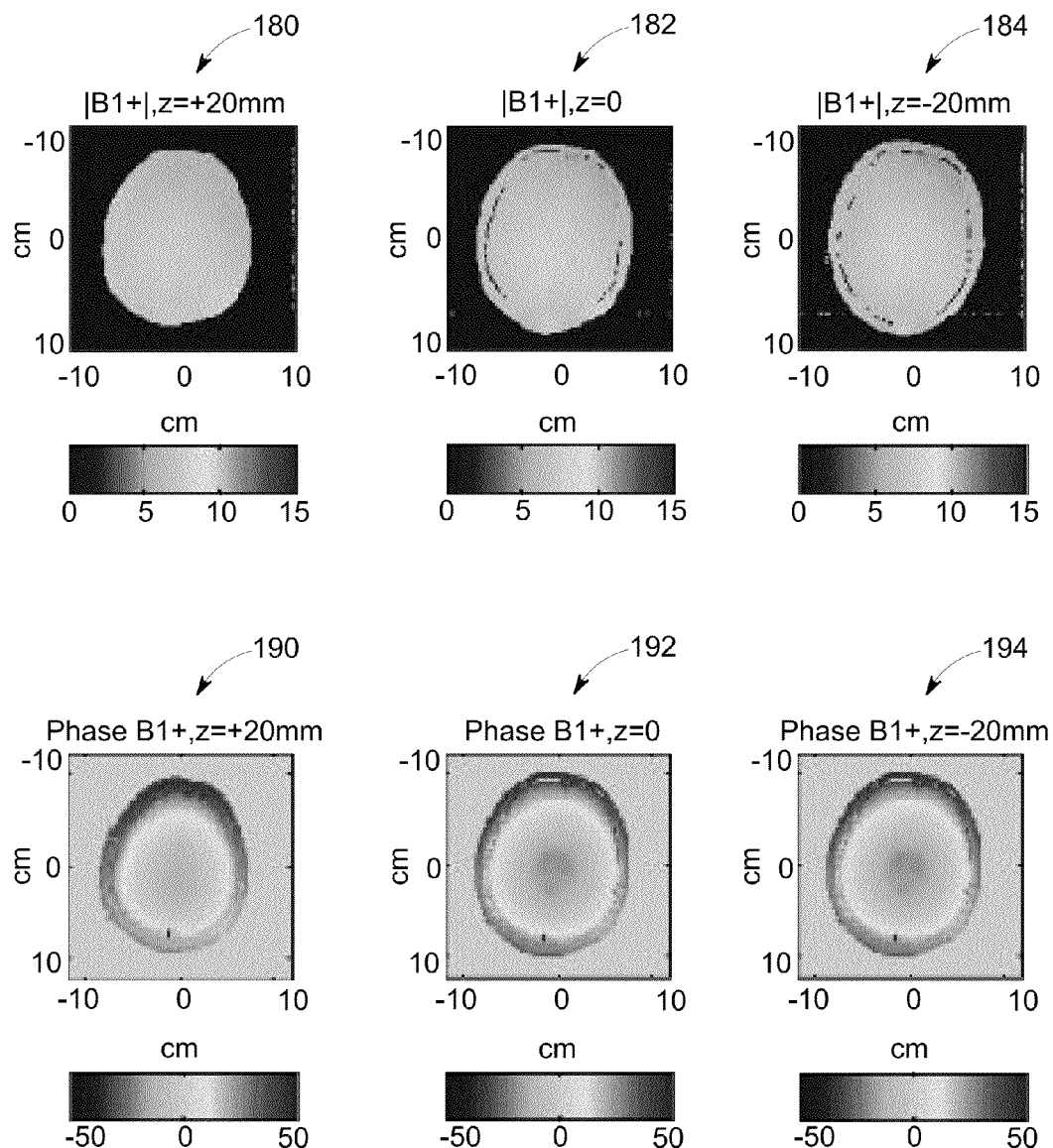
FIG. 15 illustrates images of $B_1^+$ magnitude and phase maps formed in accordance with various embodiments.

As one example, data for Bloch-Siegert based $B_1^+$ mapping may be acquired for three axial plane slices with the following parameters: FOV 24 cm, slice thickness 10 mm, spacing 10 mm, resolution 128×128, TE min full, TR 2000. The total imaging time may be about 9 minutes and 20 seconds. Thereafter, spin echo images of the same slices are acquired in about 4 minutes and 40 seconds. The $B_1^+$ maps, magnitude (images 180, 182 and 184) and phase (images 190, 192 and 194), after calculations as described above are shown in FIG. 15. The middle images 182 and 192 correspond to the central axial plane with the other images corresponding to shifted axial planes (+/−20 mm in the S/I direction).

Figure 16:
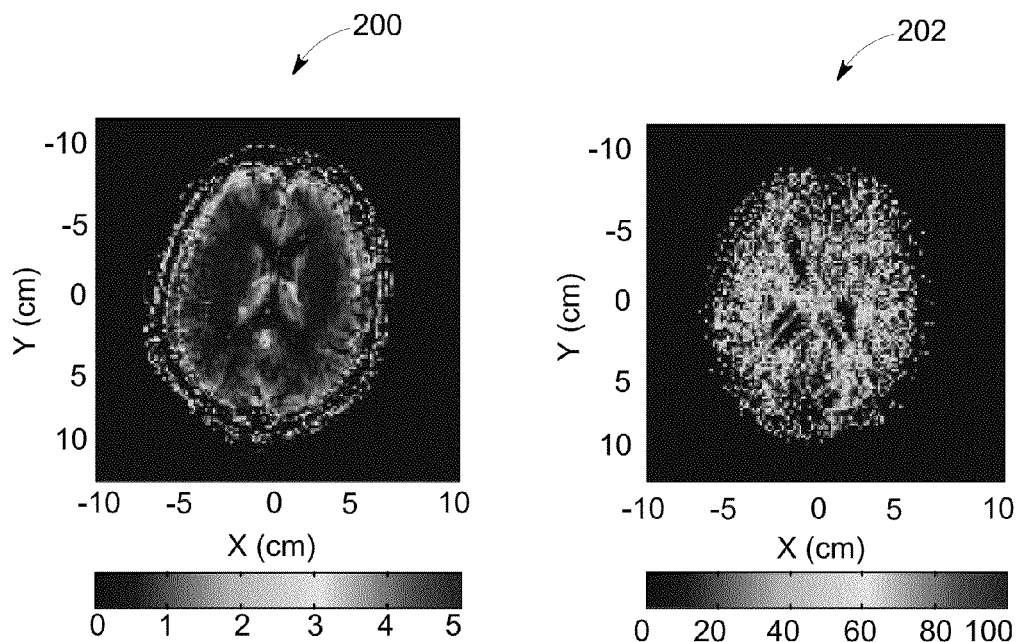
FIG. 16 illustrates conductivity and permittivity images formed in accordance with various embodiments.
Figure 17:
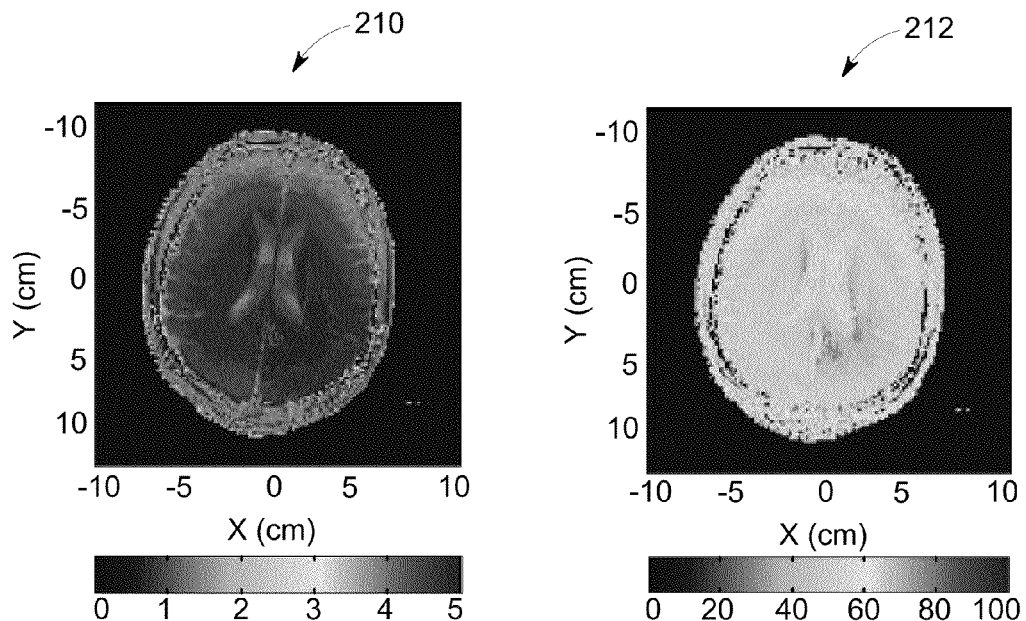
FIG. 17 illustrates conductivity and permittivity images reconstructed using segmentation in accordance with various embodiments.

Conductivity and permittivity images are then generated as described above and shown in images 200 and 202 of FIG. 16, respectively. Then, the spin echo image of the central axial plane is used in image segmentation. In particular, based on the pixel intensity of the spin echo image, 100 segments are selected in this embodiment. In each segment, the average conductivity and permittivity is selected, discarding pixels with zero values. The conductivity and permittivity images are then reconstructed, using these average values for the segments with any suitable image reconstruction technique. The results are shown in the images 210 and 212 of FIG. 17.

It should be noted that the various embodiments may be used to determine the electrical properties of different regions of a subject. Accordingly, although the head is described herein, other regions, such as the breasts may be imaged and the electrical properties estimated in accordance with the various embodiments.

Thus, in accordance with various embodiments, the direct calculation of electrical properties from $B_1^+$ maps is provided by estimating the discrete Laplacian of $B_1^+$ maps. The discrete Laplacian may be calculated in the form of difference equations. In various embodiments, the method uses $B_1^+$ at seven pixels to calculate the electrical properties at a single pixel and as a result, the resolution of the electrical properties image is lower than the resolution of the $B_1^+$ map. In human imaging, image segmentation may be used in the reconstruction of conductivity and permittivity images from calculated values.

It should be noted that although various embodiments are described in connection with using $B_1^+$ maps from a single transmitter and/or receiver, $B_1^+$ maps from multiple transmitters and/or receivers, or combinations thereof, may be used. For example, $B_1^+$ maps from multiple transmitters or receivers in a parallel transmit system may be used. Thus, the RF field in some embodiments may be measured from multiple transmitters such that $B_1^+$ maps may be generated using one or more transmitters and/or receivers.

Figure 18:
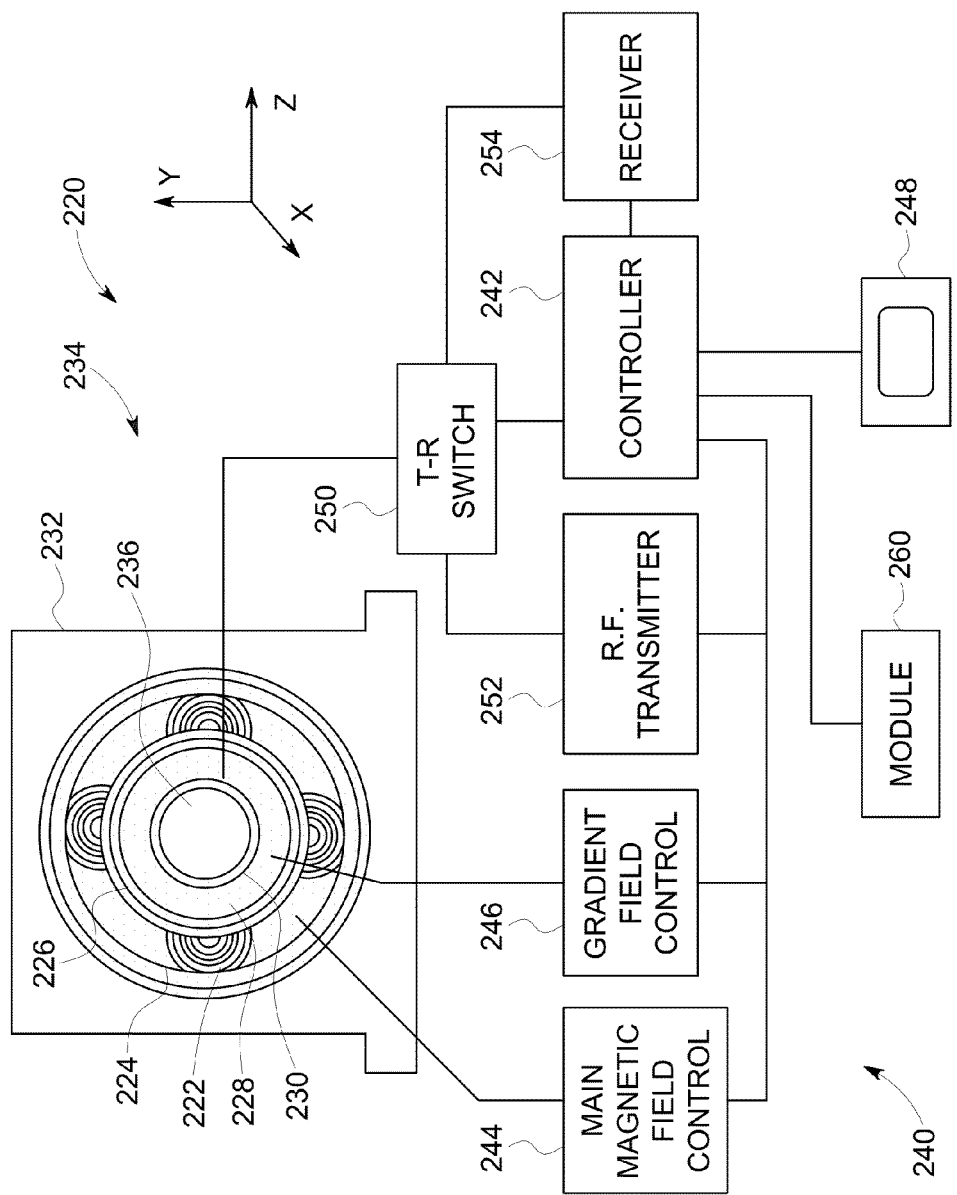
FIG. 18 is a block diagram of an MRI system formed in accordance with various embodiments.

Accordingly, various embodiments provide a non-invasive method to image tissue conductivity and permittivity. The resulting images may be used, for example, in the diagnosis of tissue abnormality, in addition to generating information to estimate heating effects due to radio frequency. For example, an MRI system 220 as shown in FIG. 18, may be used to acquire MRI data used to generate $B_1^+$ maps of a subject using, for example, the Bloch-Siegert $B_1^+$ mapping method. The $B_1^+$ maps are then further processed using a set of difference equations to estimate conductivity and permittivity as described herein. For example, for the estimation of conductivity, the $B_1$ phase is estimated by acquiring a spin echo image with a switched mode, quadrature birdcage coil and then performing further processing of the image phase to estimate the $B_1^+$ phase. The complex $B_1^+$ is then used to estimate conductivity by solving the set of difference equations as described herein.

In MR imaging, the spatial variation of the transmit $B_1^+$ field is related to the electrical properties of the imaging object. Therefore, given the spatial variation of $B_1^+$, the electrical properties of the imaging object can be inferred.

Thus, the MRI system 220 may be utilized to implement the method 20 described herein. In the exemplary embodiment, the MRI system 220 includes a superconducting magnet 222 formed from magnetic coils that may be supported on a magnet coil support structure. However, in other embodiments, different types of magnets may be used, such as permanent magnets or electromagnets. A vessel 224 (also referred to as a cryostat) surrounds the superconducting magnet 222 and is filled with liquid helium to cool the coils of the superconducting magnet 222. A thermal insulation 226 is provided surrounding the outer surface of the vessel 224 and the inner surface of the superconducting magnet 222. A plurality of magnetic gradient coils 228 are provided within the superconducting magnet 222 and a transmitter, for example, an RF transmit coil 230 is provided within the plurality of magnetic gradient coils 228. In some embodiments the RF transmit coil 230 may be replaced with a transmit and receive coil defining a transmitter and receiver.

The components described above are located within a gantry 232 and generally form an imaging portion 234. It should be noted that although the superconducting magnet 222 is a cylindrical shaped, other shapes of magnets can be used.

A processing portion 240 generally includes a controller 242, a main magnetic field control 244, a gradient field control 246, a display device 248, a transmit-receive (T-R) switch 250, an RF transmitter 252 and a receiver 254. In the exemplary embodiment, an electrical properties estimation module 260, which may be implemented as a tangible non-transitory computer readable medium, is programmed to determine electrical properties of a subject as described in more detail herein.

In operation, a patient is inserted into a bore 236 of the MRI system 220. The superconducting magnet 222 produces an approximately uniform and static main magnetic field $B_0$ across the bore 236. The strength of the electromagnetic field in the bore 236 and correspondingly in the patient, is controlled by the controller 242 via the main magnetic field control 244, which also controls a supply of energizing current to the superconducting magnet 222.

The magnetic gradient coils 228, which include one or more gradient coil elements, are provided so that a magnetic gradient can be imposed on the magnetic field $B_0$ in the bore 236 within the superconducting magnet 222 in any one or more of three orthogonal directions x, y, and z. The magnetic gradient coils 228 are energized by the gradient field control 246 and are also controlled by the controller 242.

The RF transmit coil 230, which may include a plurality of coils (e.g., resonant surface coils), is arranged to transmit magnetic pulses and/or optionally simultaneously detect MR signals from the patient if receivers, such as receive coil elements are also provided, such as a surface coil (not shown) configured as an RF receive coil. The RF transmit coil 230 and the receive surface coil are selectably interconnected to one of the RF transmitter 252 or the receiver 254, respectively, by the T-R switch 250. The RF transmitter 252 and T-R switch 250 are controlled by the controller 242 such that RF field pulses or signals are generated by the RF transmitter 252 and selectively applied to the patient for excitation of magnetic resonance in the patient.

Following application of the RF pulses, the T-R switch 250 is again actuated to decouple the RF transmit coil 230 from the RF transmitter 252. The detected MR signals are in turn communicated to the controller 242. The detected signals are then utilized to determine electrical properties of the object (e.g., patient) being imaged. The processed signals representative of an image are also transmitted to the display device 248 to provide a visual display of the image.

The various embodiments may be implemented in connection with different types of superconducting coils, such as superconducting coils for an MRI system. For example, the various embodiments may be implemented with superconducting coils for use with an MRI system 220 shown in FIG. 18. It should be appreciated that although the system 220 is illustrated as a single modality imaging system, the various embodiments may be implemented in or with multi-modality imaging systems. The system 220 is illustrated as an MRI imaging system and may be combined with different types of medical imaging systems, such as a Computed Tomography (CT), Positron Emission Tomography (PET), a Single Photon Emission Computed Tomography (SPECT), as well as an ultrasound system, or any other system capable of generating images, particularly of a human. Moreover, the various embodiments are not limited to medical imaging systems for imaging human subjects, but may include veterinary or non-medical systems for imaging non-human objects, luggage, etc.

The various embodiments and/or components, for example, the modules, or components and controllers therein, also may be implemented as part of one or more computers or processors. The computer or processor may include a computing device, an input device, a display unit and an interface, for example, for accessing the Internet. The computer or processor may include a microprocessor. The microprocessor may be connected to a communication bus. The computer or processor may also include a memory. The memory may include Random Access Memory (RAM) and Read Only Memory (ROM). The computer or processor further may include a storage device, which may be a hard disk drive or a removable storage drive such as an optical disk drive, solid state disk drive (e.g., flash RAM), and the like. The storage device may also be other similar means for loading computer programs or other instructions into the computer or processor.

As used herein, the term "computer" or "module" may include any processor-based or microprocessor-based system including systems using microcontrollers, reduced instruction set computers (RISC), application specific integrated circuits (ASICs), field-programmable gate arrays (FPGAs), graphical processing units (GPUs), logic circuits, and any other circuit or processor capable of executing the functions described herein. The above examples are exemplary only, and are thus not intended to limit in any way the definition and/or meaning of the term "computer".

The computer or processor executes a set of instructions that are stored in one or more storage elements, in order to process input data. The storage elements may also store data or other information as desired or needed. The storage element may be in the form of an information source or a physical memory element within a processing machine.

The set of instructions may include various commands that instruct the computer or processor as a processing machine to perform specific operations such as the methods and processes of the various embodiments of the invention. The set of instructions may be in the form of a software program, which may form part of a tangible non-transitory computer readable medium or media. The software may be in various forms such as system software or application software. Further, the software may be in the form of a collection of separate programs or modules, a program module within a larger program or a portion of a program module. The software also may include modular programming in the form of object-oriented programming. The processing of input data by the processing machine may be in response to operator commands, or in response to results of previous processing, or in response to a request made by another processing machine.

As used herein, the terms "software" and "firmware" are interchangeable, and include any computer program stored in memory for execution by a computer, including RAM memory, ROM memory, EPROM memory, EEPROM memory, and non-volatile RAM (NVRAM) memory. The above memory types are exemplary only, and are thus not limiting as to the types of memory usable for storage of a computer program.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the various embodiments of the invention without departing from their scope. While the dimensions and types of materials described herein are intended to define the parameters of the various embodiments of the invention, the embodiments are by no means limiting and are exemplary embodiments. Many other embodiments will be apparent to those of skill in the art upon reviewing the above description. The scope of the various embodiments of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112, sixth paragraph, unless and until such claim limitations expressly use the phrase "means for" followed by a statement of function void of further structure.

This written description uses examples to disclose the various embodiments of the invention, including the best mode, and also to enable any person skilled in the art to practice the various embodiments of the invention, including making and using any devices or systems and performing any incorporated methods. The patentable scope of the various embodiments of the invention is defined by the claims, and may include other examples that occur to those skilled in the art. Such other examples are intended to be within the scope of the claims if the examples have structural elements that do not differ from the literal language of the claims, or if the examples include equivalent structural elements with insubstantial differences from the literal languages of the claims.

What is claimed is:

1. A non-transitory computer readable storage medium for estimating electrical properties of an object using a processor, the non-transitory computer readable storage medium including instructions to command the processor to:
   determine a magnitude of a Magnetic Resonance Imaging (MRI) $B_1^+$ field applied to an object;
   determine a phase of the MRI $B_1^+$ field applied to the object;
   combine the determined magnitude and phase to determine a complex $B_1^+$ field estimate;
   estimate one or more electrical properties of the object using the complex $B_1^+$ field estimate by directly solving at least one discrete difference equation, wherein a spatial variation of the complex $B_1^+$ field is defined with respect to the one or more electrical properties; and
   display an image of the one or more electrical properties of the object.

2. The non-transitory computer readable storage medium of claim 1, wherein the instructions command the processor to reconstruct the image of the electrical properties of the object.

3. The non-transitory computer readable medium of claim 1, wherein the one or more electrical properties comprise a conductivity or a permittivity of a tissue or a sample.

4. The non-transitory computer readable medium of claim 1, wherein the difference equation is a discrete Laplacian equation and the instructions command the processor to estimate a Laplacian using the discrete Laplacian equation.

5. The non-transitory computer readable medium of claim 4, wherein the instructions command the processor to estimate the Laplacian using a curve fitting.

6. The non-transitory computer readable medium of claim 4, wherein the instructions command the processor to estimate the Laplacian using a multi-dimensional fitting.

7. The non-transitory computer readable storage medium of claim 4, wherein the instructions command the processor to calculate the discrete Laplacian equation on a plurality of scales.

8. The non-transitory computer readable storage medium of claim 1, wherein the instructions command the processor to perform $B_1^+$ mapping using a Bloch-Siegert shift to determine the magnitude of the MRI $B_1^+$ field.

9. The non-transitory computer readable storage medium of claim 1, wherein the instructions command the processor to remove a system introduced linear phase shift when determining the phase of the MRI $B_1^+$ field.

10. The non-transitory computer readable storage medium of claim 1, wherein the instructions command the processor to divide a central axial plane image into a plurality of segments and use average pixel values to replace all pixel values within at least one of the plurality of segments.

11. The non-transitory computer readable storage medium of claim 1, wherein the instructions command the processor to estimate heating effects due to radio frequency from the MRI $B_1^+$ field using the one or more estimated electrical properties.

12. The non-transitory computer readable storage medium of claim 1, wherein the instructions command the processor to determine a tissue abnormality using the one or more estimated electrical properties.

13. The non-transitory computer readable storage medium of claim 1, wherein the MRI $B_1^+$ field comprises a transmit field with $B_1^+$ data.

14. The non-transitory computer readable storage medium of claim 1, wherein the instructions command the processor to determine the magnitude and phase, combine the determined magnitude and phase, and estimate one or more electrical properties using $B_1^-$ data.

15. The non-transitory computer readable storage medium of claim 1, wherein the instructions command the processor to determine the complex $B_1^+$ field estimate using $B_1^+$ maps from (i) at least one of a single transmitter or a single receiver of an MRI system applying the MRI $B_1^+$ field, (ii) a plurality of transmitters or receivers of the MRI system or (iii) a combination of (i) and (ii).

16. The non-transitory computer readable storage medium of claim 1, wherein the instructions command the processor to directly solve the at least one discrete difference equation without the use of receiver sensitivity information.

17. A method for non-invasively imaging tissue properties, the method comprising:
   generating Magnetic Resonance Imaging (MRI) $B_1^+$ maps to determine a magnitude of an MRI $B_1^+$ field applied to a subject using a plurality of Bloch-Siegert phase shift images;
   generating MRI phase maps to determine a phase estimate of the MRI $B_1^+$ field applied to the subject using real and imaginary images of the subject;
   combining the determined magnitude and phase to determine a complex $B_1^+$ field estimate;
   estimating one or more tissue properties of the subject using the complex $B_1^+$ field estimate and a discrete set of Laplacian equations, wherein a spatial variation of the complex $B_1^+$ field is defined with respect to the one or more tissue properties; and
   displaying an image of the one or more tissue properties of the subject.

18. The method of claim 17, further comprising acquiring spin echo images to generate the MRI phase maps.

19. The method of claim 18, further comprising removing a system introduced phase shift to determine a subject induced phase variation in the spin echo images.

20. The method of claim 17, wherein estimating one or more tissue properties of the subject further comprises calculating a Laplacian on a plurality of scales using the discrete set of Laplacian equations.

21. The method of claim 17, wherein estimating one or more tissue properties further comprises calculating at least one of a permittivity or a conductivity of tissue of the subject.

22. The method of claim 17, wherein the one or more tissue properties comprise electrical properties and further comprising reconstructing the electrical properties by calculating an average value of the electrical properties in each of a plurality of segments of a region of interest of the subject and using an average value to replace all of the values for pixels within each segment.

23. The method of claim 17, wherein estimating the one or more tissue properties of the subject estimates the discrete set of Laplacian equations without the use of receiver sensitivity information.

24. A Magnetic Resonance Imaging (MRI) system comprising:
   an imaging portion configured to generate an MRI $B_1^+$ field using one or more transmitters and acquire magnetic resonance (MR) $B_1^+$ data from an object using one or more receivers;
   a processing portion having an electrical properties estimation module configured to estimate electrical properties of the object by determining a magnitude of the MRI $B_1^+$ field applied to the object, determining a phase of the MRI $B_1^+$ field applied to the object, combining the determined magnitude and phase to determine a complex $B_1^+$ field estimate and estimating one or more electrical properties of the object using the complex $B_1^+$ field estimate by directly solving at least one discrete difference equation, wherein a spatial variation of the complex $B_1^+$ field is defined with respect to the one or more electrical properties; and
   a display device configured to display an image of the electrical properties of the object.

25. The MRI system of claim 24, wherein the processing portion is further configured to use transmit field $B_1^+$ data of the MRI $B_1$ field to estimate the one or more electrical properties.

26. The MRI system of claim 24, wherein the processing portion is further configured to use receive field $B_1^-$ data to estimate the one or more electrical properties.

27. The MRI system of claim 24, wherein the processing portion is further configured to perform B1+ mapping using a Bloch-Siegert shift to determine the magnitude of the MRI B1+ field.

28. The MRI system of claim 24, wherein the processing portion is further configured to determine the complex B1+ field estimate using B1+ maps from (i) at least one of a single transmitter of the one or more transmitters or a single receiver of the one or more receivers, (ii) a plurality of the one or more transmitters or receivers or (iii) a combination of (i) and (ii).

29. The MRI system of claim 24, wherein the processing portion is configured to directly solve the at least one discrete difference equation without the use of receiver sensitivity information.

* * * * *

UNITED STATES PATENT AND TRADEMARK OFFICE
CERTIFICATE OF CORRECTION

| | | |
|---|---|---|
| PATENT NO. | : 8,942,931 B2 | Page 1 of 1 |
| APPLICATION NO. | : 13/174010 | |
| DATED | : January 27, 2015 | |
| INVENTOR(S) | : Bulumulla et al. | |

It is certified that error appears in the above-identified patent and that said Letters Patent is hereby corrected as shown below:

In the Drawings

In Fig. 18, Sheet 13 of 13, for Tag "252", in Line 1, delete "R.F." and insert -- RF --, therefor.

In the Specification

In Column 6, Line 40, delete "conductivity:" and insert -- conductivity. --, therefor.

In Column 9, Lines 16-17, delete "phantom head" and insert -- head phantom --, therefor.

In Column 11, Line 4, delete "and 142" and insert -- and 144 --, therefor.

In the Claims

In Column 15, Line 49, in Claim 3, delete "readable" and insert -- readable storage --, therefor.

In Column 15, Line 52, in Claim 4, delete "readable" and insert -- readable storage --, therefor.

In Column 15, Line 56, in Claim 5, delete "readable" and insert -- readable storage --, therefor.

In Column 15, Line 59, in Claim 6, delete "readable" and insert -- readable storage --, therefor.

Signed and Sealed this
Fifth Day of May, 2015

Michelle K. Lee
*Director of the United States Patent and Trademark Office*